(12) United States Patent
Theriault et al.

(10) Patent No.: US 6,231,289 B1
(45) Date of Patent: May 15, 2001

(54) DUAL PLATE GAS ASSISTED HEATER MODULE

(75) Inventors: Victor J. Theriault, Beverly, MA (US); Mark Ives, Merrimack, NH (US)

(73) Assignee: Brooks Automation, Inc., Chelmsford, MA (US)

( * ) Notice: Subject to any disclaimer, the term of this patent is extended or adjusted under 35 U.S.C. 154(b) by 0 days.

(21) Appl. No.: 09/559,720

(22) Filed: Apr. 26, 2000

Related U.S. Application Data
(60) Provisional application No. 60/055,332, filed on Aug. 8, 1998.

(51) Int. Cl.[7] .................................................. B65G 1/133
(52) U.S. Cl. ........................... 414/217; 118/719; 118/729
(58) Field of Search ................................ 118/719, 729, 118/728; 414/217

(56) References Cited

U.S. PATENT DOCUMENTS

| | | | |
|---|---|---|---|
| 4,632,624 | * 12/1986 | Mirkovich et al. | 414/217 |
| 4,816,638 | 3/1989 | Ukal et al. | 219/121.43 |
| 4,838,978 | 6/1989 | Sekine et al. | 156/345 |
| 4,883,020 | * 11/1989 | Kasai et al. | 118/719 |
| 5,002,010 | 3/1991 | Weinberg | 118/719 |
| 5,112,277 | * 5/1992 | Cruz et al. | 454/195 |
| 5,240,505 | 8/1993 | Iwasaki et al. | 118/719 |
| 5,512,320 | 4/1996 | Turner et al. | 427/255 |
| 5,609,689 | 3/1997 | Kato et al. | 118/719 |
| 5,613,776 | 3/1997 | Turner et al. | 374/57 |
| 5,662,469 | 9/1997 | Okase et al. | 432/6 |
| 5,778,968 | 7/1998 | Hendrickson | 165/80.1 |
| 5,795,399 | 8/1998 | Hasegawa et al. | 134/1.3 |
| 5,882,413 | 3/1999 | Beaulieu et al. | 118/719 |
| 5,883,017 | 3/1999 | Tepman et al. | 438/800 |
| 6,048,154 | * 4/2000 | Wytman | 414/217 |

* cited by examiner

Primary Examiner—Richard Bueker
Assistant Examiner—Erin Fieler
(74) Attorney, Agent, or Firm—Perman & Green, LLP

(57) ABSTRACT

A dual plate gas assisted heater module having a vertically movable poppet movable between an upper and a lower subchamber has a passive heating feature which preheats a substrate prior to introducing it into a subchamber for active heating.

11 Claims, 5 Drawing Sheets

DUAL PLATE GAS ASSISTED HEATER MODULE

This application is based upon provisional application Ser. No. 60/055,332 filed on Aug. 8, 1998, on which priority for the present application is based.

BACKGROUND OF THE INVENTION

FIELD OF THE INVENTION

The apparatus of the present invention relates generally to material transfer devices and more particularly to an improved method and article of handling substrates within a substrate transport.

The material transferred might include, but not be limited to, semiconductor wafers, such as silicone and gallium arsenide, semiconductor packaging substrates, such as high density interconnects, semiconductor manufacturing processing imaging plates, such as masks or reticles, and large area displayed panels, such as active matrix LCD substrates.

The need for high throughput transport devices which can move a substrate or workpiece between remote locations within a highly confined footprint such as found in the manufacture of wafers or panels or the like used in the semiconductor industry is in high demand. This is because in the process of manufacturing such panels, wafers or the like, the need to move a workpiece from one position to the next not only requires that a high throughput rate be achieved, but also that maximum throughput between component elements of the tool be effected. In this way, processing time for a given number of substrates can be maximized for a given tool.

Copending U.S. application Ser. No. 08/654,334 filed in the name of Hendrickson, filed on May 28, 1996 and entitled, A System for Heating or Cooling Wafers, and U.S. Pat. No. 5,588,827 entitled A Passive Gas Substrate Thermoconditioning Apparatus and Method, issued on Dec. 31, 1996 to Richard Muka, disclose a substrate transport having a main vacuum transport chamber to which a temperature transfer station is mounted. Thus, it is known in the art to connect an individual substrate thermoconditioning module to a side of the substrate transport outside of the main transport chamber. Also, copending U.S. patent application Ser. No. 08/891,532 filed under Express Mail No. EM029241165 U.S. and entitled A Substrate Processing Apparatus Having A Substrate Transport with a Front End Extension and an Internal Substrate Buffer, filed on Jul. 11, 1997 in the name of David Beaulie and Michael W. Pippins, discloses a method and apparatus for forming an integrated platform in which a wafer cooler is provided. However, the device disclosed in this patent application has an extended footprint as it uses separate elements, namely, a cooler 36, a buffer, and load locks to effect three different functions for the three separate elements. However, the fabrication and usage of the three elements occupies much needed additional footprint space which otherwise could be used for other process modules and/or cluster tools in the substrate fabrication process.

Accordingly, it is an object of the invention to provide a dual plate gas assisted heater module which is capable of transporting substrates in a vacuum environment for processing and then back to a factory interface in a manner such that no damage occurs due to thermal shock or nonuniformity in the substrate.

Another object of the invention is to provide a substrate heating module of the aforementioned type wherein the cost of fabrication is reduced by efficiency of the design and construction.

Still a further object of the invention is to provide a substrate heating module of the aforementioned type which is reduced in complexity of drive mechanisms and controls.

It is still a further object of the invention to provide substrate heating module of the aforementioned type which reduces vacuum volume thereby reducing the amount of pumping capability required to maintain adequate vacuum in the system.

Yet still a further object of the invention is to provide a substrate heating module of the aforementioned type wherein the manufacturing time, complexity of construction, alignment in time testing are reduced.

Further still an object of the invention is to provide a substrate heating module of the aforementioned type wherein service and reliability as well as reduced system time throughput are enhanced.

SUMMARY OF THE INVENTION

The invention further resides in method and apparatus employing a dual plate gas assisted heater module wherein a lift mechanism including a poppet acts as an isolation valve between upper and lower subchambers. This lift mechanism allows one plate to be heated to temperature by radiant heat while the other plate which is disposed within one of the subchambers to be boosted to temperature by gas assisted heating means. The heating module is designed to interface with a substrate handling transport chamber through a vacuum isolation valve associated therebetween and a second vacuum isolation valve oriented oppositely thereto and associated with the external environment. The dual plate heater chamber provides for gas assisted or active heating in either chamber depending on the position of the poppet as moved by the lift mechanism. The poppet is capable of carrying a substrate on the upper and lower sides thereof such that by moving the poppet vertically, the top side substrate is moved into the uppermost subchamber where gas assisted heating can be effected and at the same time through radiant heat, the substrate disposed on the lower surface of the poppet becomes heated. Once the substrate on the topmost side of the poppet fully heated by gas assisted heating, the poppet is moved and the substrate exposed on the other side of the poppet is accordingly located in the lower subchamber where gas assisted heating is accomplished. In so doing, the first fully heated substrate is placed in alignment with the port or doorway of the main chamber of the transport apparatus and is capable of being reached or moved by the substrate holder contained therein. Since the poppet upper holding means and the poppet lower holding means are equally versatile at receiving and holding a substrate, it is irrelevant whether the poppet is in either an uppermost or lowermost position when loading or unloading of a substrate occurs. In either position, a substrate may still be loaded or off-loaded onto and off of the poppet.

The heating module, in summary, comprises a base on which is supported a main module chamber and includes a first and a second subchamber each selectively communicating with the module main module chamber and being disposed vertically spatially apart with respect to one another such that the main module chamber separates the first and second subchambers. A movable member disposed within the main chamber and communicating between each of the first and second subchambers to cause sealing of one of the first and second subchambers when the movable member is moved toward and into engagement with a selective one of the first and second subchambers.

Ideally, the main chamber includes at least one valve for providing selectively controllable access to the module main chamber and the movable member has two vertically spaced apart planar support surfaces disposed on vertically opposites sides thereof.

Desirably, each of the two vertically planar spaced apart support surfaces of the movable member is located on the movable member at a distance such that when the movable member is moved between the first and the second subchambers, one of the first and second planar support surfaces is disposed in alignment with the at least one gate valve.

Preferably, each of the first and second chambers is a cylindrically shaped member opening as a circle into the main chamber, the circle opening of the subchambers each having a diameter which is smaller than the surface area of the movable member which confronts it.

In the preferred embodiment, each of the first and second subchambers having a means for communicating an inert gas between the supply of inert gas and each of the chamber and for providing a vacuum source in selective communication with each of the first and second subchambers.

Ideally, the movable member is a substantially circular member having an outer diameter which is somewhat larger than the diameters of each of the circular opening defining each of the first and second subchambers; and the circular opening of the subchambers being disposed about the juncture of the main chamber and each of the subchambers and an annular seal being provided at the juncture for engagement with an associated face of the circular member.

Desirably, the circular vertically movable member has a top surface associated with the first subchamber and capable of being disposed in line with the at least one gate valve when the vertical member is moved to a lowered position, and a plurality of L-shaped holding members depend from the lower surface of the circular member, the generally L-shaped holding members being radially directed inwardly from points which are inwardly disposed relative to the inner diameter of each of the first and second subchambers.

Ideally, the L-shaped members have a generally horizontal portion which extends in a plane generally coincident with the at least one gate valve when the movable member is moved into an upper position coinciding with sealing of the first subchamber.

BRIEF DESCRIPTION OF THE DRAWINGS

The foregoing aspects and other features of the present invention are explained in the following description, taken in connection with the accompanying drawings, wherein.

DETAILED DESCRIPTION OF THE PREFERRED EMBODIMENT

Figure 1:
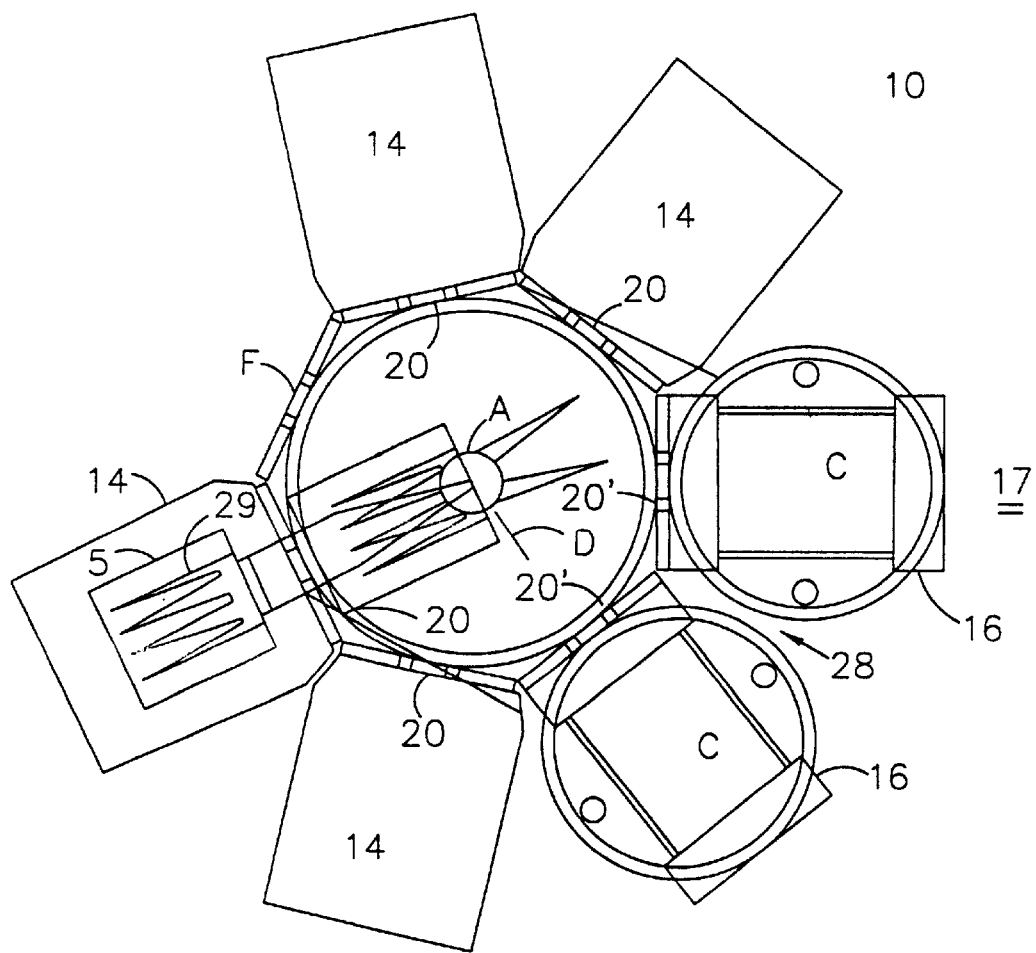
FIG. 1 is a top plan view of a substrate processing apparatus shown schematically incorporating the features of the present invention.

Referring to FIG. 1, there is shown a schematic top plan view of a substrate processing apparatus 10 incorporating features of the present invention. Although the present invention will be described with reference to the single embodiment shown in the drawings, it should be understood that the present invention can be embodied in many alternate forms of embodiments. In addition, any suitable size, shape or type of elements or materials could be used.

The apparatus 10 includes a main section 12, substrate processing modules 14, substrate heating modules 16, and an exterior section 17. The section 17 may include means for holding cassettes of substrates and a robot (not shown) for moving the substrates into and out of the heating modules 16. In alternate embodiments, any suitable substrate loading system, manual and/or automatic computer controlled, could be used for loading substrates into the heating modules 16. In another embodiment, the side face or facet F of the apparatus 10 may be connected to a vacuum tight duct through which substrates are passed. This duct would in turn be connected to another apparatus which would include an external interface through which substrates are passed.

Figure 2:
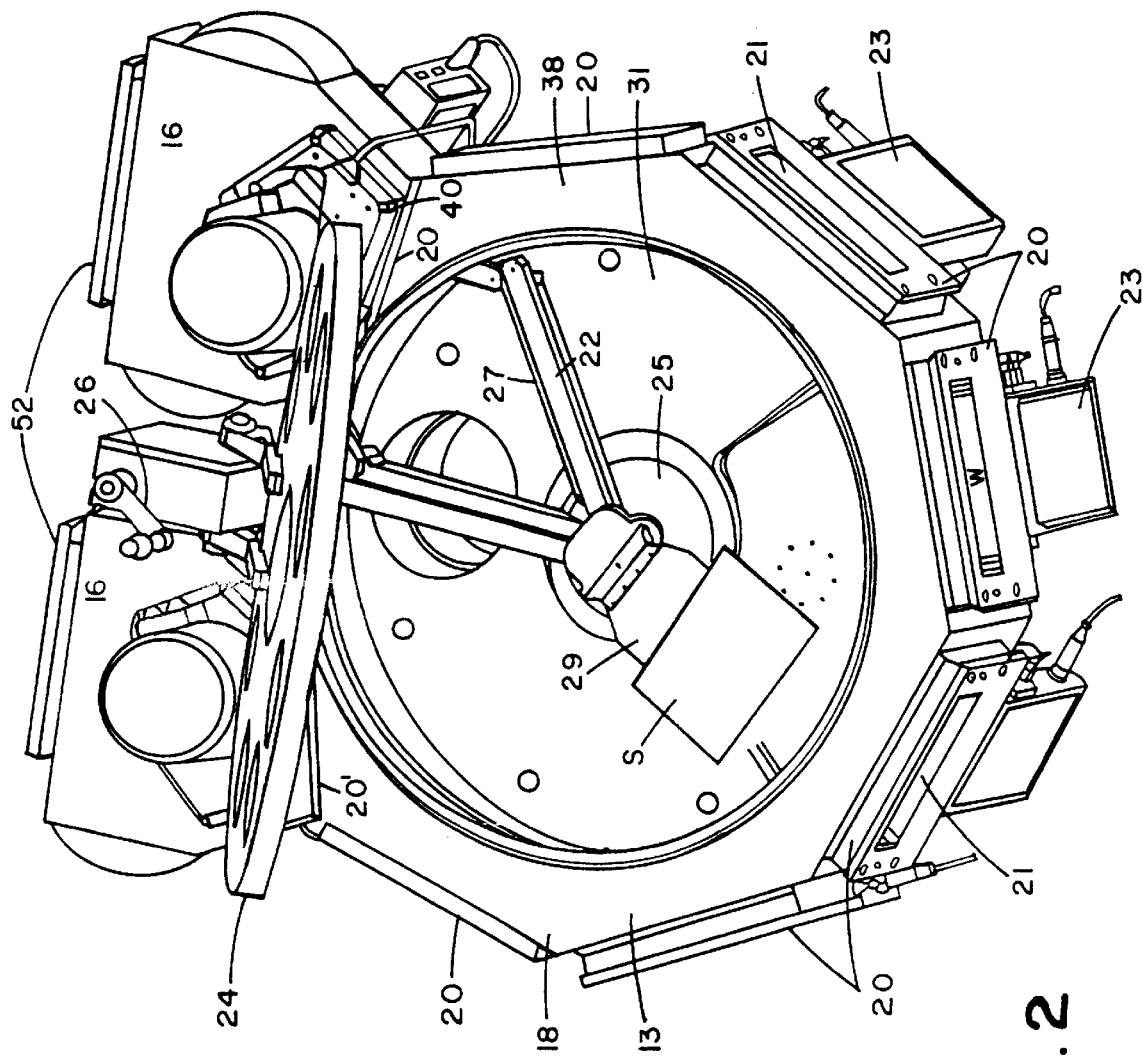
FIG. 2 is a perspective view of the main section of the apparatus shown in FIG. 1.

Referring also to FIG. 2, a perspective view of the main section 12 is shown. The cover 24 is shown in an up position for illustration purposes. During normal operation, the cover 24 is closed and sealed on top of the frame 18. The main section 12 is a substrate transport having a housing 13 and a substrate transport mechanism 22. The housing 13 has a frame 18 with multiple side apertures having associated door sections or valves 20,20'. The modules 14, 16 are connected to the door sections 20,20'.

The door sections 20 have doorways 21 with movable door mechanisms or valves to open and close the doorways. The substrate processing modules 14 and the heating modules 16 are well known in the art. The substrates S could be semi-conductor wafers, flat panel display substrates, or any other type of substrate. The substrate transport mechanism 22 is provided for moving the substrates S among the modules 14, 16.

The substrate transport mechanism 22 has a drive section 25, a movable arm section 27 and two substrate holders 29. The holders 29 can be moved through the doorways 21 into and out of the modules 14, 16 to move the substrate S into and out of the modules 14, 16. A similar substrate transport mechanism is described in PCT patent publication No. WO 94/23911 which is hereby incorporated by reference in its entirety. However, any suitable type of substrate transport mechanism can be used. The housing 13 includes the movable top cover 24 and a cover movement crank 26. The front end 28 of the housing 13 has one or more heating modules 16,16. The term "front end" is used merely for descriptive purposes. The extended section could be located on any side of the housing, could be spaced from paths to and from the heating modules, and/or could comprise multiple extended sections. Depending on the application, see copending U.S. applications Ser. Nos. 60/055,329 (provisional for) 09/084,457, filed concurrently herewith and entitled, Single Substrate Load Lock With Offset Cool Module And Buffer Chamber", herein incorporated by reference, one of the heating modules could be defined by the structure disclosed therein, while the other such heating module may be defined by the structure of the present application. Thus, the substrate handler heating modules 16, 16 could include a substrate degas/pre-heater, a combined substrate heater/cooler, cooler or heater/cooler, or any other suitable type of substrate handler. The heating modules connect directly to the housing 13 so as to extend outwardly at an angle so as to allow the nearby substrate processing modules 14 to be angled and positioned as shown. This helps to orientate all of the substrate processing modules at efficient locations and spacings with the main section 12. The front section being defined by heating modules 16,16, is comprised of separate pieces removably connected to the rest of the frame 18, or alternatively could be formed integrally with the front end of the housing 12. Desirably, the front section, as defined by one or more of the heating modules 16,16, has a chamber(s) which is/are in selective vacuum communication with the main chamber 31. The general length D as measured from the substrate heating module center C in each heating module 16,16 to the axis A of rotation of the transport mechanism 22 of the front extended section 30 is sufficiently short to allow the movable arm section 27 of the transport mechanism 22 to pass through the valves 20',20' associated with the front section of the housing 13 and into the heating modules 16,16. The housing 13 forms a main transport chamber 31 therein.

The main transport chamber 31 has the movable arm section 27 therein and the doorways 21 are located at the outer perimeter of the chamber 31. The chamber 31 is maintained as a substantially closed environment. The valves 20,20' at the doorways 21 can be temporarily opened for inserting and removing substrates with the modules 14,16. Preferably, the main chamber 31 is maintained in a vacuum. However, the main chamber 31 could alternatively be filled with an inert gas.

Figure 3:
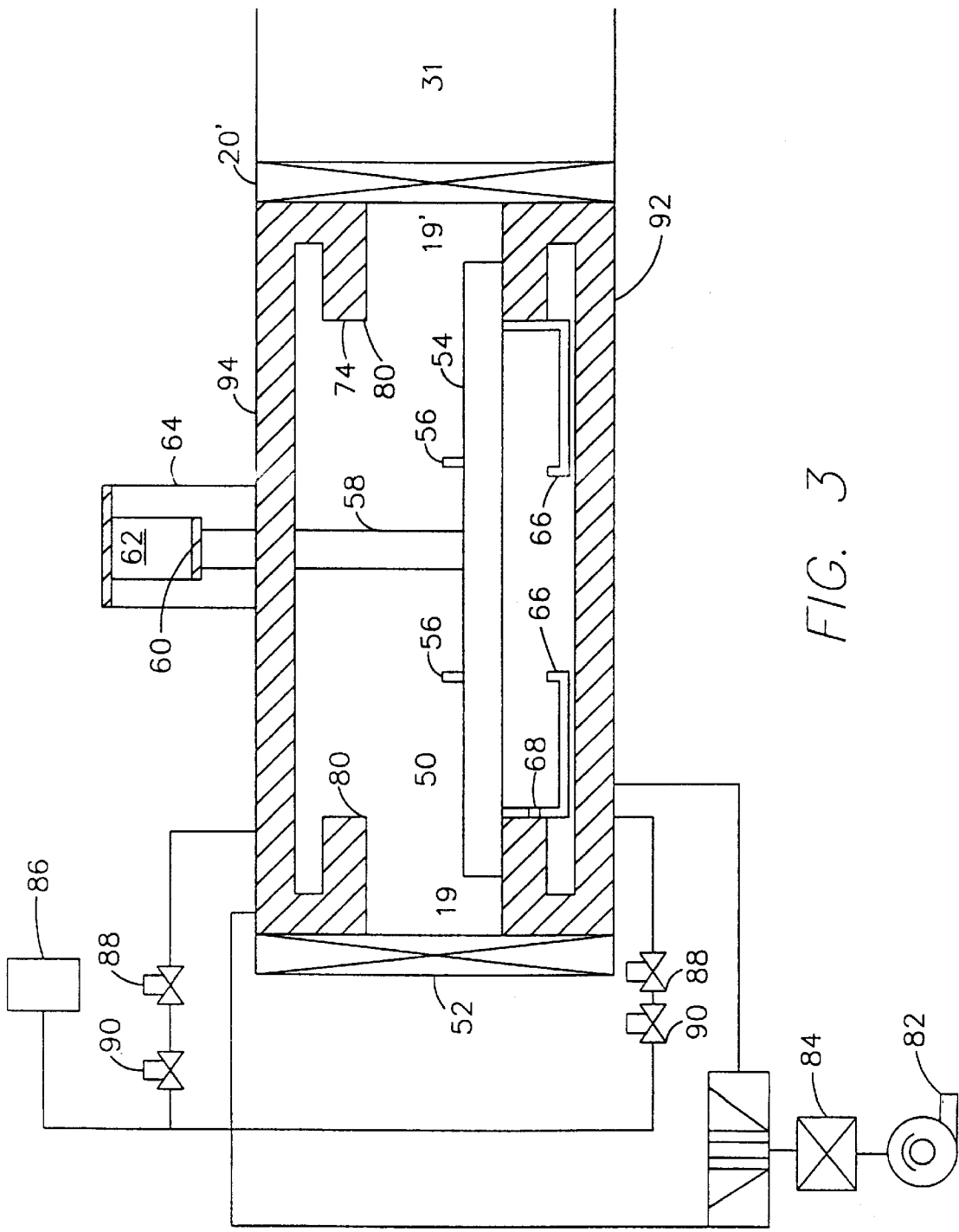
FIG. 3 is a partially fragmentary vertical section taken through the heating module of the present invention showing the substrate poppet in its down position.
Figure 4:
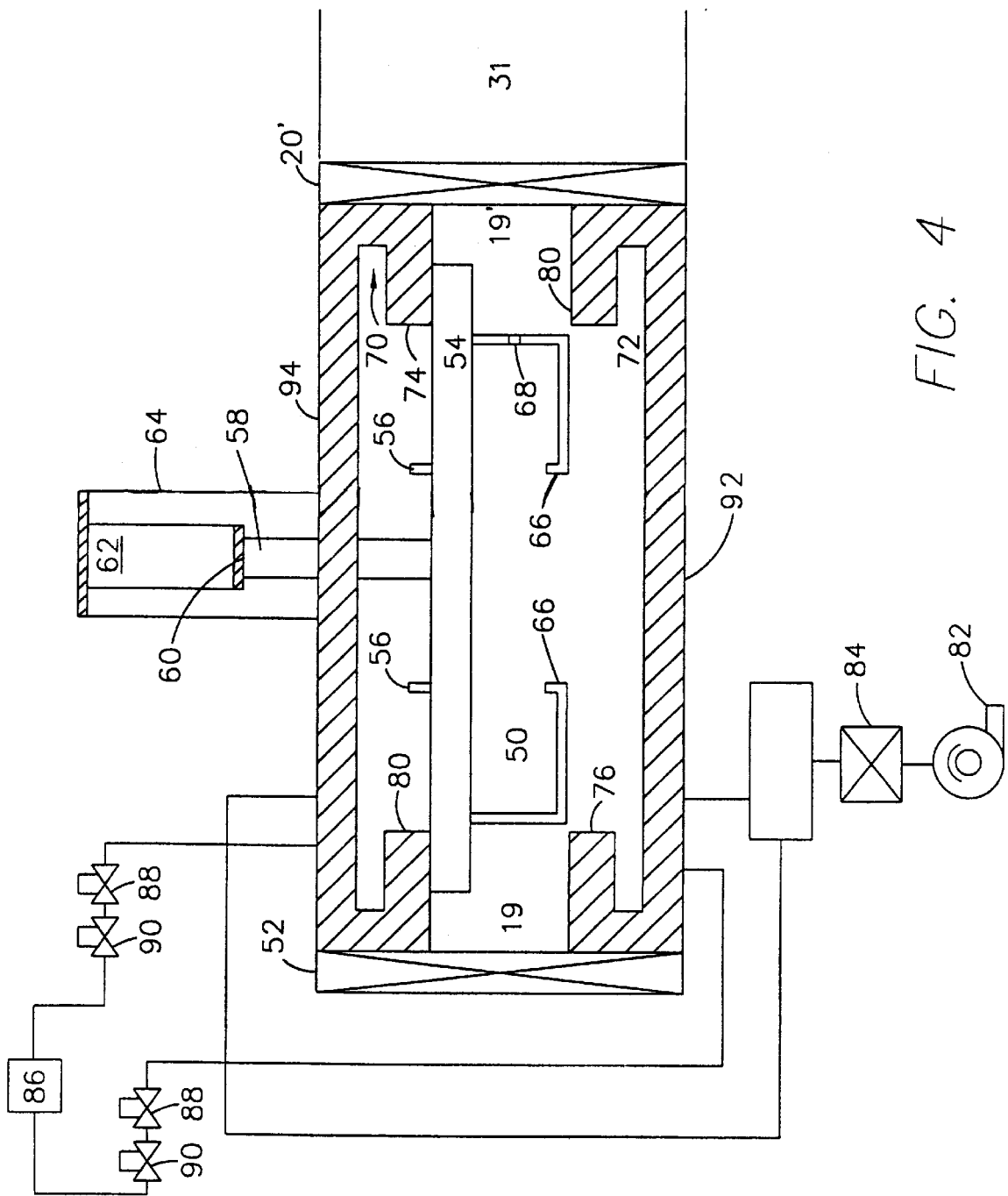
FIG. 4 is a partially fragmentary vertical section taken through the heating module of the invention showing the substrate poppet in its vertically up condition.

Referring now to FIGS. 3 and 4, and in particular to the heating module 16,16 of the invention, it should be seen that the heating modules 16 are provided with two valves, the first of which as discussed previously is valve 20' which is disposed intermediate the main transport chamber 31 of the transport mechanism 22 and an internal chamber 50 of the heating module. Opposite the valve 20' is a similar valve 52 which is associated with the external environment 17 and an aperture 19 in the heating module. A like aperture 19' exists at the other end of the heating module adjacent the valve 20'.

Figure 5:
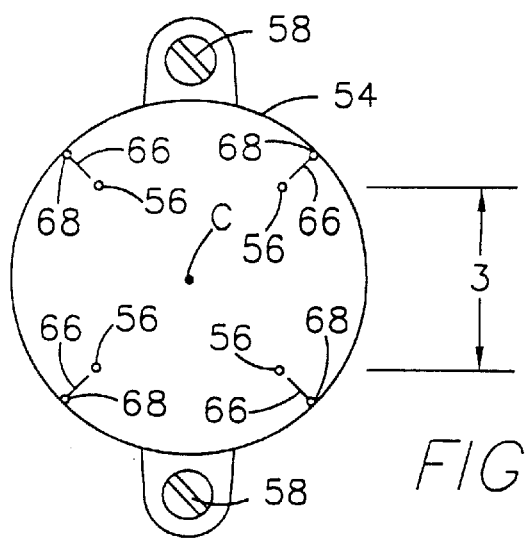
FIG. 5 is a bottom view of the poppet.

Vertically movably disposed within the chamber 50 of the heating module 16 is a substantially circular support plate or poppet 54 having upstanding standoffs 56 for mounting a substrate thereon. The sides of the poppet 54 are each connected with two vertically movable rods 58,58 which are connected to one another via horizontally disposed transverse bar 60 which is in turn moved by an actuator 62 secured to a cantilevered post member 64 which is mounted to the top of the heating module 16. As seen in FIG. 5, depending from the undersurface of the poppet 54 are a plurality of L-shaped inwardly directed holding pins 66,66 with depending portions 68 fixedly secured to the undersurface of the poppet 54. Referring for the moment to FIG. 5, it should be seen that the depending portions 68,68 of the holding pins 66 are located laterally outwardly beyond the width W of the doorway/port 19' associated with the valve 20' such that the substrate S passes freely through and into the internal chamber 50 of the heating module 16 without interference from the depending portions 68 of the pins 66,66 when the poppet 54 is in the upwardly raised condition.

The internal chamber 50 of the heating module 16 is defined by two working subchambers. The first of which subchambers is defined by an upper subchamber 70 located in the top portion of the chamber 50 and a lower subchamber 72. Each of the subchambers 70 and 72 is defined by a circular opening 74, 76, respectively, in communication with the internal chamber 50. Disposed about each of the openings 74 and 76 is an annular gasket 80,80 which is capable of sealing each of the subchambers in the manner which will be discussed in greater detail later. As is illustrated in the drawings, the diameter of the circular poppet 54 is greater than the diameter of the openings 74 and 76 formed in the housing of the heating module 16. Thus, as the poppet 54 is moved between vertical up and vertical down positions as shown respectively in FIGS. 4 and 3, the force applied in each such direction by the actuator 62 is sufficient to cause sealing by one of the corresponding upper and lower surfaces of the poppet 54 with a juxtaposed one of the annular gaskets 80,80 fixed to the heating module housing about each of the openings 74 and 76. As such, it should be understood that each of the subchambers 70 and 72 is capable of being sealed relative to the remainder of the internal chamber 50 by virtue of the vertical movement of the poppet 54. In other words, the movement of the poppet 54 between vertically up and down positions causes the poppet to behave like an isolation valve between the two subchambers 70 and 72.

Communicating with each of the upper and lower subchambers 70 and 72 is a vacuum source 82 which can selectively introduce vacuum between the subchambers 70 and 72 through the intermediary of a roughout valve 84. Each of the subchambers 70 and 72 is in further communication with a source of inert gas 86 through the intermediary of a backfill valve 88 and recharging valve 90. Each of the upper and lower subchambers 70 and 72 also includes a hot plate 92, 94 which is capable of passively heating the confines of the respective chamber in a manner which will be discussed later.

It is a feature of the invention to provide the poppet with a conventional heating means, such as with a resistance element, so as to cause it to work as a hot plate. In this mode, the poppet along with the heat generated by the plates 92 and 94 in the subchambers 70 and 72 provide passive heating sources.

In operation it is often necessary to heat up substrates prior to introduction into one or more of the processing modules 14,14. It should be understood that a substrate which has not undergone a degas step, must be heated sufficiently to drive off volatiles prior to such processing. Accordingly, the heating modules 16,16 provide a means by which active and passive heating of a substrate can occur concomitantly to effect a more efficient flow of substrates through the machine.

Figure 6:
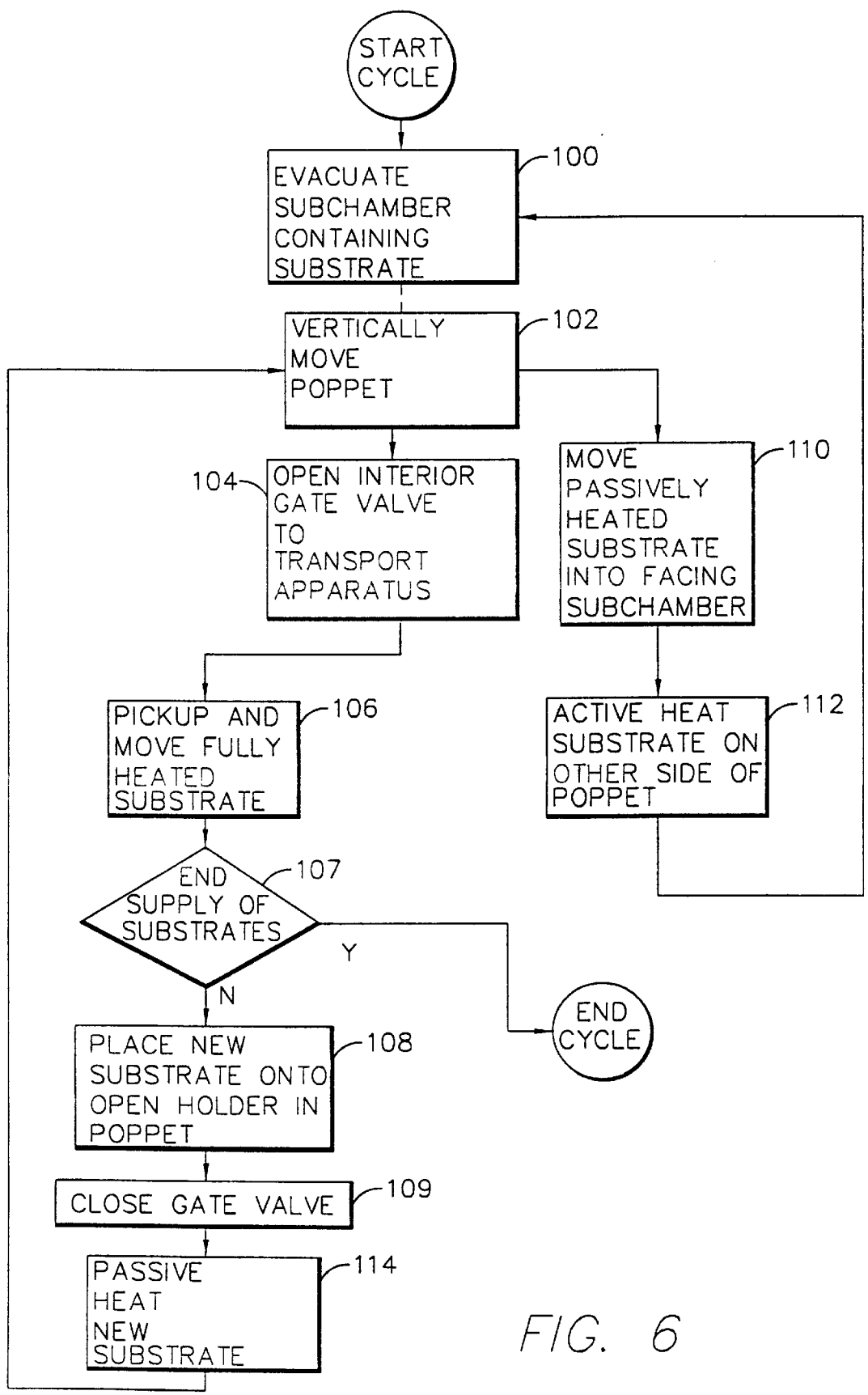
FIG. 6 is a flow chart of one scheme which is capable of being employed by the heating module of the invention.

For example, a substrate introduced into the heating module 16 through the gate valve 20' from the main chamber 31 follows a path such as described below and as illustrated in FIG. 6. This example assumes for illustration purposes that two substrates are already being carried by the poppet, one is in residence in one of the subchambers 70,72 and one carried/supported by the other side of the poppet.

The poppet can be in either an upper or lower condition depending on which subchamber was previously used. The poppet is vertically moved in order to position the substrate previously maintained in a subchamber in position with the opening 19' associated with the gate valve 20'. Thereafter, depending whether the poppet was moved upwardly or downwards, one of the substrates previously contained within either of the upper or the lower subchambers 70 or 72 is now moved into alignment with the opening 19.

Before the poppet is moved however, e.g. lowered in the case where a substrate is contained in the upper subchamber 70, the involved subchamber must be brought down to the pressure of the main chamber 31 (step 100). This is because the subchamber which fully heated the substrate was involved in active heating. By active heating, it is meant that the chamber is filled with an inert gas to supplement the radiant heat generated by the heating plate 92 or 94 associated with that subchamber. The introduction of gas into a subchamber will cause the pressure in that subchamber to be raised between 1 and 10 Torr which is well suited for gas assisted heating. Thus, once the gas assisted heating is completed, vacuum is applied and gas is drawn out of the involved subchamber using lines communicating with that subchamber 70 and 72 and the poppet is lowered (step 102). Thereafter, the interior gate valve 20' is opened (step 104) and the substrate holder 29 on the transport apparatus 22 is moved through the opening 21 and picks up the now fully heated substrate and moves it into the main chamber for a processing through one or more of the modules 14,14 (step 106). The apparatus then places a new substrate onto the poppet to be heated (step 108) and the gate valve is closed (step 109). In the event that no new substrate is supplied at step 108, then the cycle ends (step 107).

In so moving the poppet vertically, the substrate held on the other side of the poppet is automatically moved into the other of the subchamber 70 or 72 (step 110) whereupon inert gas is introduced into that camber which now becomes the active heating chamber for that substrate by the introduction of inert gas therewithin (step 112). As mentioned before, it is a feature of one embodiment of the invention to use passive heat on the substrate before occupying a subchamber within the heating module 16. This can be done by making the poppet a heat plate and/or by simply using the heat generated from the opened subchamber to heat the substrate. In either case, the substrate is maintained at distance from one or both heat sources, e.g. the poppet, if heating is provided in the poppet, and the exposed one of the hot plates 92, 94, sufficient to transfer the heat radiantly to the substrate which is presently not yet contained within one of the subchambers 70 and 72. Thus, while the substrate contained in one of the upper or lower subchambers 70 and 72 is being subjected to active heating,. the other is brought to temperature while being held by the poppet.

Once the substrate contained in the involved subchamber 70 and 72, is heated to the appropriate temperature, the poppet is moved vertically such that the now adequately heated substrate is placed in line with the opening 21 of the transport apparatus. In so doing, the substrate carried on the other side of the poppet is moved into the facing subchamber where it undergoes active heating.

Moreover, the movement of the poppet between vertical positions automatically seals the subchamber towards which it is moved. Thus, a vacuum is created and maintained by such movement in the involved subchamber thereby allowing inert gas to be introduced to that subchamber without passing into the remainder of the internal chamber 50. Thus, a substrate being held either by the standoffs 56,56 or the depending holders 66,66 in the general chamber 50 is subjected to passive heating until such time that the substrate contained in one of the upper or lower subchambers 70 and 72 has completed the full active heating cycle. Thereafter the poppet is moved vertically such that the now fully heated substrate is positioned in line with the opening 19' of the transport apparatus where a pick and place operation occurs wherein the fully heated substrate is taken away and a new unheated substrate is substituted. The newly loaded substrate automatically undergoes a passive heat treatment (step 114) in the general chamber 50 while the substrate already in residence is moved into a subchamber to undergo active heating.

It is during this pick and place operation that the active heating of the other substrate occurs almost in sequence with the pick and place operation. This sequencing is aided by the preheating accomplished through the passive heat mode discussed above.

In some circumstances it may be necessary to use the external valve 52 to access the internal chamber 50. During this period, the outer valve 52 would be opened to the external environment and the inner gate valve 20' would be closed. A dummy substrate used for cleaning the process modules could be inserted into the internal chamber 50. Thereafter, the outer gate valve 52 would be closed to the external environment and evacuated by the vacuum source 82. Thereafter the inner gate valve 20' would be opened and the poppet would not be moved vertically. The substrate holder 29 would be moved through the opening 19' and pick the cleaning substrate off the poppet holder for subsequent processing in one or more of the processing module chambers.

By the foregoing, a dual plate gas assisted heater module has been described by way of the preferred embodiment in illustrated method steps. However numerous modifications and substitutions may be had without departing from the spirit of the invention.

What is claimed is:

1. A dual plate gas assisted heater module comprising:
    a main module having an internal chamber and including first and second vertically spaced annular gasket members;
    a first and a second subchamber each selectively communicating with the main module internal chamber and being disposed vertically spatially apart with respect to one another such that the internal chamber separates the first and second subchambers;
    a movable disk-shaped poppet member disposed within the internal chamber and engageable with the first and second annular gasket members to cause sealing of one of the first and second subchambers when moved toward and into engagement with a selective one of the first and second subchambers.

2. A heater module as defined in claim 1 further characterized by the main chamber including at least one valve for providing selectively controllable access to said internal chamber.

3. A heater module as defined in claim 2 further characterized by the movable disk-shaped poppet member having upper and lower vertically spaced apart planar support surfaces disposed on vertically opposites sides thereof.

4. A heater module as defined in claim 3 further characterized by each of the two vertically planar spaced apart support surfaces of said movable member being located on said movable member at a distance such that when said movable member is moved, respectively, between engagement with the first and second subchambers, one of said first and second planar support surfaces is disposed in alignment with the at least one gate valve.

5. A heater module as defined in claim 4 further characterized by each of the first and second chambers being cylindrically shaped opening shaped as a circle into the main module internal chamber, the circle opening of the first and second gasket members each having a diameter which is smaller than the surface area of the movable disk-shaped poppet member.

6. A heater module as defined in claim 5 further characterized by each of the first and second subchambers having a means for communicating an inert gas between the supply of inert gas and each subchamber.

7. A heater module as defined in claim 6 further characterized by means for providing a vacuum source in selective communication with each of the first and second subchambers.

8. A heater module as defined in claim 7 further characterized by providing the movable disk-shaped poppet member as a substantially circular member having an outer diameter which is larger than the diameters of the circular opening of each of the first and second gasket members; and the circular opening into each of the subchambers being disposed about the juncture of the main chamber and each of the subchambers and an annular seal being provided at the juncture for engagement with an associated face of the circular disk-shaped poppet member.

9. A heater module as defined in claim 8 further characterized by the circular vertically movable disk-shaped poppet member having a top surface associated with first subchamber and capable of being disposed in line with the at least one gate valve when the disk-shaped poppet member is moved to a lowered position.

10. A heater module as defined in claim 9 further characterized by a plurality of L-shaped holding members depending from the lower support surface of the circular disk-shaped poppet member, the generally L-shaped holding members being radially directed inwardly from points which are inwardly disposed relative to the inner diameter of each of the first and second subchambers.

11. A heater module as defined in claim 8 further characterized by the L-shaped members having a generally horizontal portion which extends in a plane generally coincident with the at least one gate valve when the movable disk-shaped poppet member is moved into an upper position coinciding with sealing of the first subchamber.

\* \* \* \* \*